United States Patent

[11] 3,615,934

[72] Inventor Robert W. Bower
Palos Verdes, Calif.
[21] Appl. No. 678,809
[22] Filed Oct. 30, 1967
[45] Patented Oct. 26, 1971
[73] Assignee Hughes Aircraft Company
Culver City, Calif.
Continuation-in-part of application Ser. No. 590,033, Oct. 27, 1966, now Patent No. 3,472,712.

[54] INSULATED-GATE FIELD-EFFECT DEVICE HAVING SOURCE AND DRAIN REGIONS FORMED IN PART BY ION IMPLANTATION AND METHOD OF MAKING SAME
3 Claims, 10 Drawing Figs.

[52] U.S. Cl. .......... 148/186,
317/235 R, 317/235 B, 317/235 AL, 148/1.5
[51] Int. Cl. .......... H01l 7/44,
H01l 11/14
[50] Field of Search .......... 317/235
(21), 235 (21.1), 235 (24), 235 (40), 235 (48), 235 (48.4), 235 (22.2); 148/1.5

[56] References Cited

UNITED STATES PATENTS

| | | | |
|---|---|---|---|
| 3,102,230 | 8/1963 | Kahng | 323/94 |
| 3,290,567 | 12/1966 | Gowen | 317/234 |
| 3,341,754 | 9/1967 | Kellett et al. | 317/234 |
| 3,434,021 | 3/1969 | Hofstein | 317/235 |
| 3,341,754 | 9/1967 | Kellett | 317/234 |
| 3,434,894 | 3/1969 | Gole | 148/187 |
| 3,449,648 | 6/1969 | Beale | 317/235 |

*Primary Examiner*—John W. Huckert
*Assistant Examiner*—Martin H. Edlow
*Attorneys*—James K. Haskell and W. H. MacAllister, Jr.

ABSTRACT: Field effect device having diffused major source and drain regions spaced from each other on a common surface of a semiconductor body with insulated gate member disposed on same surface and spaced from and between the source and drain regions, and shallow regions formed by ion implantation using the gate member as a mask extending from the periphery of the gate member to the source and drain regions.

Robert W. Bower,
INVENTOR.
BY.
W. H. MacAllister Jr.
ATTORNEY.

INSULATED-GATE FIELD-EFFECT DEVICE HAVING SOURCE AND DRAIN REGIONS FORMED IN PART BY ION IMPLANTATION AND METHOD OF MAKING SAME

This is a continuation in part of my copending application entitled "FIELD EFFECT DEVICE WITH INSULATED GATE," Ser. No. 590,033, filed Oct. 27, 1966 now U.S. Pat. No. 3,472,712, and assigned to the instant assignee.

This invention relates to semiconductor devices and especially to transistor devices in which the conductivity of a relatively shallow region in a semiconductor body is modulated by means of an electric field. More particularly, the invention relates to transistor structures of the type known as insulated-gate field-effect transistors.

Operation of transistors of the type to which the present invention appertains is based upon the control of the conductivity of a conduction channel in a semiconductor body which channel is induced by an electric field established therein by an insulated control gate as well as by surface charges which may be ionic in nature. Transistors of this type are usually formed by deposition and diffusion techniques. In such transistors, majority charge carriers (electrons or holes) flow through the solid state semiconductor material from an electrode usually called the "source." The conductive path for these charge carriers, hereinafter called the "channel," is induced by an electric field and surface charges and occurs at surface and near-surface regions of the semiconductor body. In the absence of this induced channel, the flow of such charge carriers cannot occur. The charge carriers move or flow in the induced channel toward a second electrode called the "-drain." Control (modulation) of the current flowing through this channel is achieved by means of a control or "gate" electrode. By this gate, the conductivity of the channel and hence the electron or hole current reaching the drain can be varied. This control electrode or gate is insulated from the semiconductor material to prevent the majority carriers from flowing to it and to prevent it from acting as a source or drain. Normally these devices are operated in a drain-voltage region where the drain current saturates or reaches a maximum, nearly constant value because the channel is pinched off or terminated very close to the drain region and acts as a current generator, the current being only a function of the gate voltage and not of the drain voltage. Thus, these devices basically exhibit a useful drain voltage-drain current characteristic similar to a vacuum pentode.

Such devices are known in the art and the structure and operation thereof have been amply described, especially by Hofstein and Heiman in an article entitled "Silicon Insulated-Gate Field-Effect Transistor" published in the Sept. 1962 Proceedings of the I.E.E.E. commencing on page 1190. In one arrangement of such a field-effect transistor, the source and drain constitute spaced regions of like conductivity type disposed on the the same surface of a semiconductor body with the gate arranged over the space between the source and drain regions and separated therefrom by an insulator. A typical prior art arrangement is shown in the above-mentioned article by Hofstein and Heiman. As noted, the gate electrode is insulated from the semiconductor material so that the gate electrode will not itself act as a source or drain electrode and may yet exert its control by field effect in the space between the source and drain electrodes.

It will be appreciated that it is highly desirable to precisely position the gate, which in prior art devices is generally of metal, over the space or channel region between the source and drain electrodes of the device. This permits the channel region between the source and drain to be completely modulated by the gate. If the gate is too wide relative to the channel region, undesirable and excessive stray capacitance is developed which reduces the frequency response of the device. If the gate is too small relative to the channel region and does not cover it in its entirety, undesirable ohmic and nonohmic losses are introduced into the device and low transconductance may result. The mask alignment problems involved in prior devices having a small channel region are severe since an extremely narrow gate must be precisely fitted over the channel region. Often in such prior art devices some compromise was accepted and the gate electrode was intentionally permitted to overlap the drain electrode in order to relieve the mask alignment problem. As noted, this results in the introduction of an undesirable feedback capacitance usually referred to as Miller feedback capacitance.

It is therefore an object of the invention to provide an improved insulated-gate field-effect device.

It is another object of the present invention to provide an improved method for making an insulated-gate field-effect device.

A further object of the invention is to provide an improved method for making a field-effect transistor of the insulated-gate type.

Another object of the invention is to provide an improved method for making a field-effect transistor of the insulated-gate-type and characterized by low Miller feedback capacitance.

Still another object of the invention is to provide an improved method for making a field-effect transistor having a source-drain channel effectively controlled by an insulated-gate structure.

Yet another object of the invention is to provide an improved method for making a field-effect transistor in which an insulated gate is precisely located over the channel region between the source and drain regions thereof.

Still another object of the invention is to provide an improved method for locating an insulated gate over the channel region in a field-effect transistor which avoids critical and difficult gate alignment problems.

Yet another object of the invention is to provide an improved method for making a field-effect device of the insulated-gate-type whereby the total gate capacitance may be reduced to only that useful in modulating the conductivity of the channel therein.

These and other objects and advantages of the instant invention are achieved by first forming by diffusion into a semiconductor body relatively widely spaced source and drain regions having a desired electrical resistivity and of a conductivity type opposite to that of the semiconductor body. An insulated gate-member is then formed on the surface of the channel region formed in the semiconductor body by the spacing of the source and drain regions. This gate member is spaced from and is between the source and drain regions, thus leaving a gap- or gate-uncovered portion of the channel region between the gate member and the source and drain regions. By leaving this gap, critical and difficult to achieve gate alignment problems are avoided. The gate itself is then used as a mask against ion implantation as taught in my aforementioned copending application, Ser. No. 590,033, of which this application is a continuation-in-part. In effect, relatively shallow, ion implanted extensions of the source and drain regions are formed which terminate at the periphery of the gate member. Thus, by using the gate as a mask, the proper conductivity-type determining impurities may be implanted into the portions on channel region of the semiconductor body adjacent the gate member so as to close the gap between the source and drain regions on the one hand and the gate member on the other hand.

In contrast to the diffusion techniques of the prior art for introducing such impurities into a semiconductor body which impurities diffuse into the body in at least two directions (i.e., vertically and laterally,) ion-implanted impurities penetrate the body in only one direction (vertically.) Hence, by the process of the invention, the impurities for extending the source and drain regions in the semiconductor body do not spread laterally under the gate-mask member, thus permitting one to achieve a structure in which the gate is precisely positioned over the channel region between the source and drain regions, without any overlap whatsoever. By being able to form the major source and drain regions by diffusion one is able to more conveniently obtain source and drain regions of the requisite low resistivity than where the source and drain regions are provided solely by ion implantation. On the other hand critical gate alignment problems are avoided by using ion implantation to bridge the source and drain regions over to the gate.

The invention will be described in greater detail by reference to the drawings in which:

FIGS. 1(*a*) through 1(*d*) are cross-sectional elevational views of portions of an insulated-gate field-effect device in various stages of fabrication thereof according to the invention;

Figure 1A:
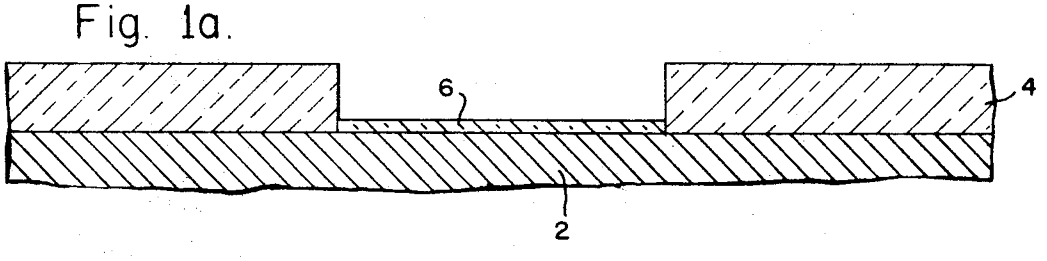
Figure 1B:
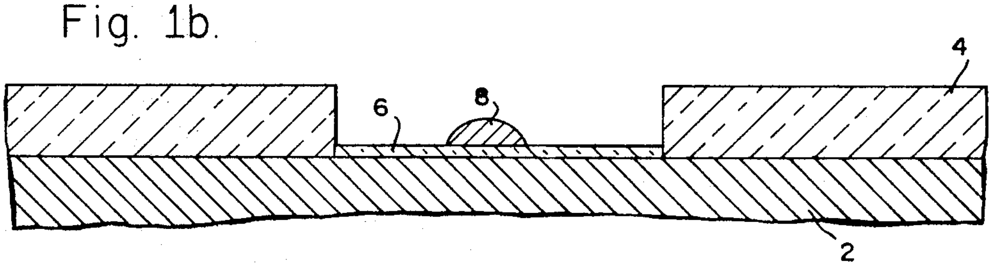
Figure 1C:
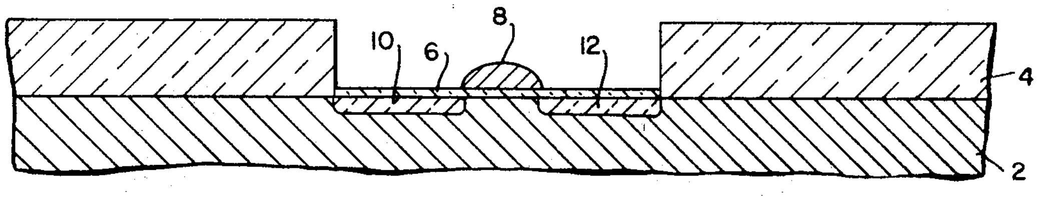
Figure 1D:
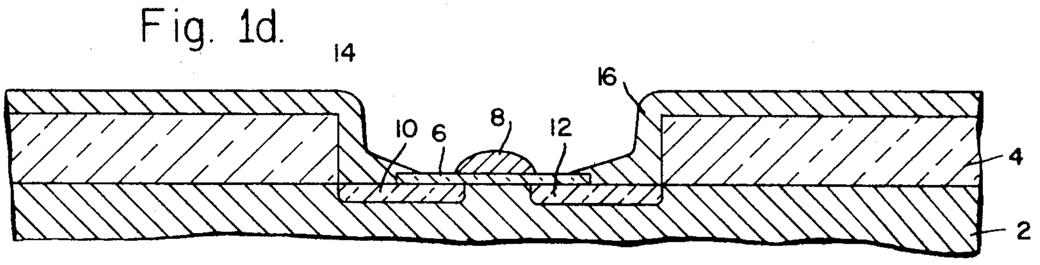

Before proceeding to a detailed description of the process of fabricating a device according to the invention, a brief explanation of ion implantation phenomena may be helpful. What is ultimately required are atoms capable of establishing the desired type of conductivity in a semiconductor body and which atoms are also capable of being positioned and controlled as to velocity and direction. Thus, in the conventional diffusion process, while there is a supply of atoms capable of establishing the requisite conductivity, by and large these atoms are usually in a vapor state and are not controllable except by thermodynamic techniques. In effect, the atoms in a diffusion process "drift" into contact with an exposed surface of a semiconductor body and continue to drift into the semiconductor body in a more or less random fashion in accordance with thermodynamic principles. In an ion implantation process, the impurity atoms, which are otherwise of neutral charge or polarity, are given a predetermined electrical charge or "ionized." Such charged atoms are therefore referred to herein as ions. By means of electric fields, these ions may then be formed in beams of various cross-sectional diameters and shapes and may also be caused to travel in predetermined directions at predetermined velocities much like the electrons in an electron beam. In short, therefore, instead of drifting into the lattice structure of a semiconductor body in random directions, these ions may be made to enter the lattice in a predetermined direction and may be positioned where desired therein. In addition, the concentration of such impurities in the semiconductor body is readily controllable and may be made uniform or graded throughout the implanted region as desired. To sum up, ions of a desired conductivity-type-determining impurity may be made to enter a semiconductor body in a fixed and desired direction with little or no deviation therefrom and may be placed therein where desired to establish a region of given conductivity-type of precise geometry and depth. One of the important advantages of the process is the fact that the semiconductor body need not be heated to excessive temperatures (i.e., above 550° C.) which in other doping processes often deleteriously affects the semiconductor and renders precise control of a device during fabrication tedious and expensive.

Referring now to the drawings, the fabrication of a strip-type field-effect device will be described in connection with FIGS. 1(*a*) through 1(*d*). It will be understood that a strip-type device is one in which the source and drain regions (and hence the channel region therebetween) are in the form of strips running on the surface of a semiconductor body from one side thereof to the other. In FIG. 1(*a*), a portion of a semiconductor body 2, which exemplarily may be of N-type silicon, is shown. An initial step in the fabrication of a device of this type may be the formation of a thick layer 4 of material on the surface of the semiconductor body 2 which layer is capable of preventing ions from reaching the underlying silicon body. A typical material for this purpose may be silicon oxide. Another suitable material is silicon nitride. The material constituting this layer 4 should be electrically insulating to obviate electrically shorting or otherwise adversely affecting the device in operation.

It will be appreciated that the velocity of the ions to be implanted and the depth of implantation desired will, in general, determine the minimum thickness of the mask layer 4. As a general rule, the thickness of the mask layer 4 should at least exceed the depth of ion implantation desired in the semiconductor body 2. Typically for an ion-implanted source and drain depth of from 0.2 to 0.6 micron, the layer 4 may be about 0.1 to 0.6 micron thick. It will also be appreciated that the requisite thickness of the mask layer 4 is also a function of the ion energy employed during implantation. The exemplary thickness given for a mask of silicon dioxide is suitable for low energy ion implantation. In the case of high-energy ion implantation, a silicon dioxide mask of about 1.0 micron in thickness is satisfactory. The mask layer 4 may be formed to the desired thickness simply by oxidizing surface portions of the semiconductor body 2 in accordance with teachings well known in the art.

The next step is to form a hole or opening in the mask layer 4 corresponding to the source-drain-gate regions to be formed in the semiconductor body 2 in side-by-side fashion. By photoresist and etching techniques, also well known in the art, a suitable opening may be formed as shown in FIG. 1(*a*). This step exposes the desired surface of the semiconductor body which surface is thereafter recovered with a thin layer 6 of electrically insulating material so as to permit a gate electrode member to be disposed thereon and electrically isolated from the semiconductor body 2. The thickness of the insulating layer 6 should be such that the ions to be implanted in the semiconductor body 2 may penetrate therethrough to the desired depth. Typically, the thickness of the insulating layer 6 may be about 0.1 to 0.2 micron in order to accommodate fabrication of a device having source and drain regions of the depths indicated previously. A satisfactory material for the insulating layer 6 may again be silicon oxide conveniently formed by oxidizing the exposed surface of the silicon body 2. Silicon nitride may also be used for this purpose. It is also possible to remove portions of this insulating layer 6 except under the gate electrode member 8 after the gate has been formed thereon so as to leave the surface of the semiconductor body directly exposed to ion implantation. This may be particularly desirable where a low energy ion beam is being employed.

The next step in the process is to form the gate itself at the desired location on the insulating layer 6. The gate may be of metal and of aluminum, for example. One method for forming the gate is to vapor-deposit metal entirely over the insulating layer 6 and then by photoresist and etching techniques remove the metal (and portions of the oxide layer 6) from unwanted areas to thereby leave the gate member 8 in place as shown in FIG. 1(*b*) and electrically insulated from the underlying semiconductor body by the insulating layer 6 remaining under the gate. Alternatively, the gate may be formed by vapor-depositing metal through a mask or template to the desired shape and position.

The assembly is now ready to have source and drain regions formed on either side of the gate 8 by ion implantation with the gate acting as a mask or barrier against implantation in the portion of the semiconductor body 2 under the gate. To this end, the semiconductor body as shown in FIG. 1(*b*) is placed into a suitable apparatus for forming and directing a beam of ions capable of establishing the desired type of conductivity toward the surface of the semiconductor body on which the gate-mask member 8 is disposed. In the instant case where the semiconductor body is of N-type silicon, ions of a P-type or acceptor impurity will be utilized. A typical acceptor impurity is boron. The ions penetrate and are implanted in the underlying semiconductor body (through the thin insulating layer 6 if left on) except in regions under the thick masking layer 4 and the gate member 8 as shown in FIG. 1(*c*). Since the ions penetrate into the semiconductor body 2 in paths substantially perpendicular to the surface thereof, the perimeters of the implanted regions 10 and 12, constituting the source and drain portions of the device, respectively, are in substantially perfect alignment with the edges of the masking layer 4 and the mask-gate member 8. Hence, the gate member 8 neither overlaps nor fails to cover the underlying channel region 11 to any significant degree.

Figure 2:
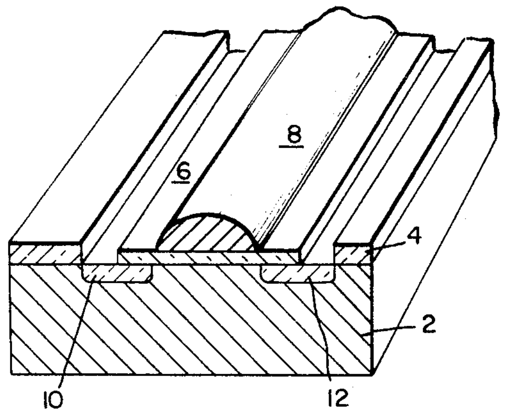
FIG. 2 is a perspective view, partly in section, of an insulated-gate field-effect device fabricated according to the invention.

After the source and drain regions 10 and 12 have been thus formed, portions of the insulating layer 6, if left on, covering the source and drain regions may be removed, as by selective etching. As shown in FIG. 1(*d*), metal (i.e., aluminum) may be deposited on the exposed surfaces of the source and drain regions and on adjacent portions of the mask layer 4 to provide electrical contacts 14 and 16, respectively, to the source and drain regions. As shown in FIG. 2, the contacts 14 and 16 do not have to be disposed entirely over the source and drain regions 10 and 12 but only to portions thereof. In addition, the metal deposited on the mask layer 6 need only be of sufficient area to facilitate the making of electrical circuit connections thereto as by soldering, for example.

Figure 3:
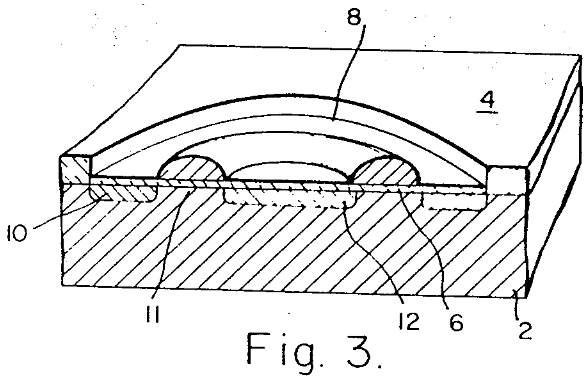
FIG. 3 is a perspective view, partly in section, of another embodiment of an insulated-gate field-effect device fabricated according to the invention.
Figure 4:
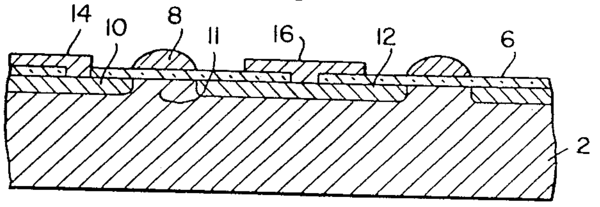
FIG. 4 is a cross-sectional elevational view of still another embodiment of an insulated-gate field-effect device fabricated according to the invention.
Figure 5:
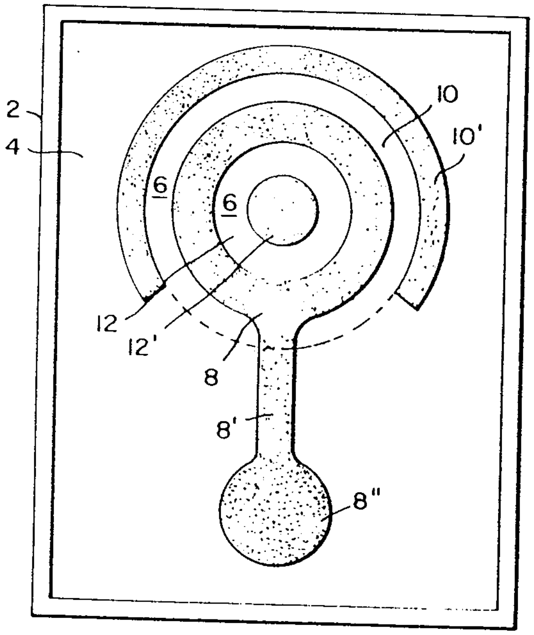
FIG. 5 is a plan view of the device shown in FIG. 3.

In FIG. 3, another embodiment of an insulated-gate field-effect device is shown wherein the configuration is annular rather than of the strip-type. This device may be fabricated exactly as described in connection with the device of FIGS. 1 and 2. In the embodiment of FIG. 3, the circular drain region 12 is surrounded by an annular channel region 11 which in turn is surrounded by an annular source region 10. It is also possible to eliminate use of the thick masking layer 4 which serves principally to limit the extent of the source and drain regions in the strip-type device of FIGS. 1–2 and the annular source region in the device of FIG. 3. Thus, it is possible to provide a useful strip-type device wherein the source and drain regions extend outwardly or away from the channel region 11 to the periphery of the semiconductor body. In such arrangement, the entire surface of the semiconductor body 2 would be subjected to ion implantation except for the masked portion 11 under the gate member 8. Likewise, in the circular geometry device of FIG. 3, the source region could extend outwardly for as far as desired simply by omitting the thick masking layer 4 thereover and subjecting the desired area to ion implantation. The thin insulating layer 6 can be left on the surface in these embodiments to protect the same from adverse effects of the ambient, implantation being achieved through this layer with a high energy ion beam as described previously. A typical device is shown in FIG. 4 wherein the source region 10 is of unrestricted extent. Thus, in the embodiment of FIGS. 4 and 5, a circular drain region 12 is surrounded by an annular channel region 11 which in turn is surrounded by a source region 10 which extends to the periphery of the semiconductor body, for example. Disposed on the drain region 12 is a drain contact member 16. The gate member 8 is provided with an extension 8' thereof which terminates in a relatively large area 8'' to facilitate the making of electrical circuit connections to the gate. A semiannular or U-shaped contact member 14 is disposed on the source region 10. The remaining surface of the semiconductor body 2 may be covered with a protective film or layer 6 of insulating material such as silicon oxide, for example. Such an insulating film may also be disposed where necessary to achieve electrical isolation of contacts such as under the gate extension 8' and the connection pad 8'' therefor, for example.

Figure 6:
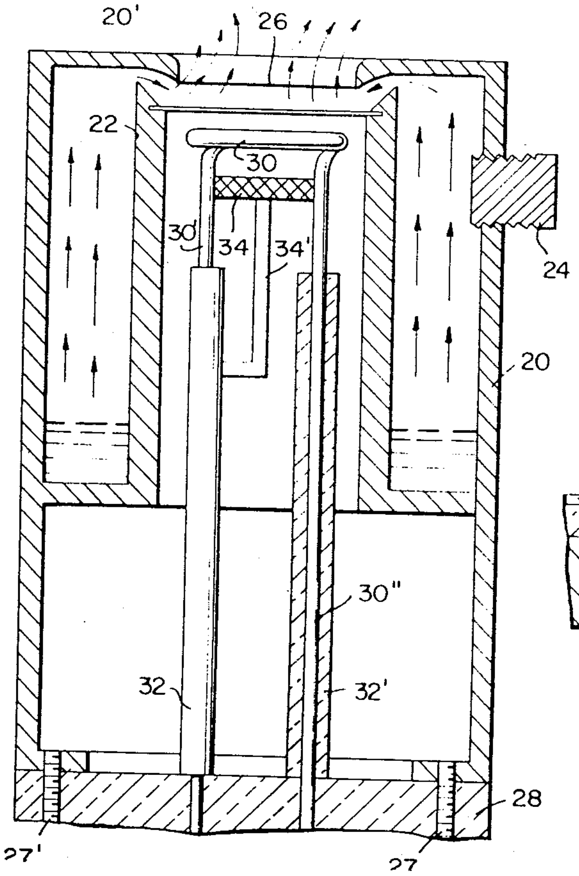
FIG. 6 is a partly schematic, partly cross-sectional view in elevation of an ion source suitable for use in the practice of the present invention.

In FIG. 6, apparatus suitable for generating an ion beam for the implantation purposes of the process of the invention is shown. The apparatus shown is an ion beam source which is adapted to be disposed in an evacuated chamber (not shown) with the semiconductor body in which it is desired to implant ions of desired conductivity type. The semiconductor body will be positioned with respect to the ion source so as to be impinged by the ion beam emerging therefrom and accelerated by means of suitable electrodes (not shown.)

The ion source shown in FIG. 6 comprises essentially a cylinder of material which will not react with the dopant material at the temperatures necessary to achieve ionization thereof. A satisfactory material for this purpose is molybdenum. The molybdenum cylinder 20 is provided near its top with an inner reservoir portion 22 in which the dopant material is supplied, a loading plug 24 being provided for that purpose. The upper end of the cylinder 20 is provided with an inwardly turned cover portion 20' which extends in and over but is spaced from the inner wall 22 forming the reservoir portion of the apparatus. Disposed across the reservoir-forming inner wall 22 is an ionizer element 26 which may be of iridium, for example, in the form of a thin ribbon. The bottom of the cylinder 20 is bolted by bolts 27 and 27' to an electrically and thermally insulating base member 28 which may be of ceramic material. A tungsten heater element 30 is maintained just under and adjacent to the ionizer element 26 and is supported by means of the extensions 30' and 30'' of the filament which extend down through the cylinder 20 and through the base 28 for connection to an appropriate power supply (not shown.) The filament support leads 30' and 30'' may be disposed in electrically and thermally insulating sleeve members 32 and 32'. In order to direct heat produced by the heater filament 30 to the ionizer element 26, a heat shield member 34 may be provided under the heater filament 30 and supported by means of a rod 34' secured to one of the insulating sleeve members such as 32.

In operation with a suitable current supplied to the heater element 30, the dopant material in the reservoir, which dopant material may be indium, for example, is heated to a temperature of around 1,300° K. The dopant material thereupon forms a liquid which settles at the bottom of the reservoir 22 and a vapor which rises to the top of the reservoir. The dopant vapor escapes from the top of the reservoir due to the shape of the deflecting cover portion so as to impinge on the ionizer element 26. The ionizer element because of its proximity to the heater element 30 may be operated at a temperature of about 1,800° K. When the atoms of the dopant material impinge upon the ionizer element 26, they become charged and, by means of suitable accelerating electrodes (not shown) maintained at proper potential and polarity, the ions thus formed are given a prescribed trajectory and velocity. In this manner, a beam of ions is emitted from the ion source for impingement on the semiconductor body whereby dopant atoms are planted therein as desired. Where, in the foregoing description, reference has been made to high and low ion beam energies, it should be understood that energies of 100 kv. or more are considered high energy.

Figure 7:
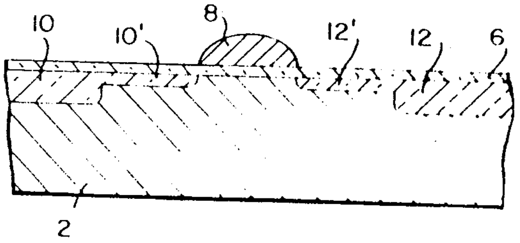
FIG. 7 is a cross-sectional elevational view of an embodiment of the invention in which major source and drain regions are formed by diffusion and extended to the gate by ion implanted shallow regions.

Referring now to FIG. 7 which is an embodiment to which the instant continuation part application is directed, the source and drain regions are formed only in part by ion implantation according to the techniques described hereinbefore. It has been found advantageous to form the major source and drain regions 10 and 12 by diffusion in order to obtain regions of desirable low resistivity. Such low-resistivity regions are very conveniently provided by the diffusion process and may be about 2 microns deep, for example. However, because of the fact that diffusion in a semiconductor body proceeds laterally as well as vertically into the crystal structure, sufficient space is left between the diffused source and drain regions 10 and 12 so that the diffusion will not proceed laterally under the gate. As is well known in the art, the source and drain regions are formed by diffusing the appropriate conductivity-type determining purity through an oxide mask 6 which may be left in place. Thereafter, the metal gate member 8 may be formed as described hereinbefore on the oxide layer 6 over the channel region and spaced from both the source and drain regions 10 and 12. The gate member 8 may advantageously be symmetrically positioned between the source and drain regions 10 and 12. Thereafter, by using the gate 8 as mask against ion-implanted regions or extensions 10' and 12' respectively of the source and drain regions 10 and 12 may be formed. These implanted regions or extensions 10' and 12' close up the gaps in the channel region between the gate member 8 and the diffused source and drain regions 10 and 12. In actual practice these ion-implanted 10' and 12' are relatively shallow (e.g., 0.2 micron) relative to the diffused source and drain regions 10 and 12 and contact, respectively, the source and drain regions 10 and 12 on one side and extend toward each other, terminating at about the edge of the gate member 8. The termination of the source and drain extensions 10' and 12' is determined, of course, in accordance with or by the masking action of the gate member 8 against ion implantation.

There thus has been shown an improved insulating-gate field-effect device in which source and drain regions of desirable electric properties are provided in a structure in which the gate does not overlap either the source or drain to avoid such undesirable effects as Miller feedback capacitance and which structure permits fabrication without embodying critical and tedious gate alignment problems.

What is claimed is:

1. The method of fabricating an insulated-gate field-effect device comprising the steps of:
   a. introducing conductivity-type-determining impurities into a semiconductor body of a first conductivity-type to form spaced source and drain regions of conductivity-type opposite to said first type while leaving a channel region between said source and drain regions;
   b. placing an insulated-gate electrode member on a portion of the surface of said channel region and laterally spaced from said source and drain regions;
   c. and causing ions of a conductivity-type-determining impurity to impinge on the surface of said channel region whereby ions are implanted in all of said channel region except the region thereof under said insulated-gate electrode member to establish ion implanted regions of said conductivity-type opposite to said first type.

2. The invention according to claim 1 wherein said conductivity-type-determining impurities are introduced into said semiconductor body by diffusion.

3. The method of fabricating an insulated-gate field-effect device comprising the steps of:
   a. diffusing spaced source and drain regions of a first conductivity-type in a semiconductor body of opposite conductivity-type while leaving a channel region between said source and drain regions, said source, drain and channel regions having surfaces disposed on a common surface of said semiconductor body;
   b. forming an insulating layer at least on said surface of said channel region;
   c. forming a gate electrode member on a portion of said insulating layer on said channel region and laterally spaced from said source and drain regions;
   d. and implanting ions of a conductivity-type-determining impurity in portions of said channel region through portions of said insulating layer other than those portions covered by said gate electrode member to thereby form discrete regions of said first type of conductivity in said channel region, said discrete regions extending respectively from adjacent the region under said gate electrode member to and contacting said source and drain regions.

* * * * *